United States Patent
Baillie-Hamilton

(10) Patent No.: US 6,837,606 B2
(45) Date of Patent: Jan. 4, 2005

(54) LIGHT EMITTING DEVICE AND ARRAYS THEREOF

(75) Inventor: William John Baillie-Hamilton, Cardiff (GB)

(73) Assignee: Fibre Optic Lamp Company Limited, Wales (GB)

( * ) Notice: Subject to any disclaimer, the term of this patent is extended or adjusted under 35 U.S.C. 154(b) by 0 days.

(21) Appl. No.: 09/171,583

(22) PCT Filed: Apr. 23, 1997

(86) PCT No.: PCT/GB97/01121
§ 371 (c)(1),
(2), (4) Date: Nov. 24, 1998

(87) PCT Pub. No.: WO97/40520
PCT Pub. Date: Oct. 30, 1997

(65) Prior Publication Data
US 2003/0086270 A1 May 8, 2003

(30) Foreign Application Priority Data

| Apr. 23, 1996 | (GB) | ............................................. 9608381 |
| Mar. 4, 1997 | (GB) | ............................................. 9704423 |
| Apr. 4, 1997 | (GB) | ............................................. 9706862 |

(51) Int. Cl.$^7$ ............................................................. G02B 5/02
(52) U.S. Cl. ........................................ 362/558; 362/581
(58) Field of Search .......................... 362/31, 551, 558, 362/582, 572, 574, 120, 581

(56) References Cited

U.S. PATENT DOCUMENTS

| 1,662,150 | A | * | 3/1928 | Kerr ............................... 362/574 |
| 2,362,175 | A | | 11/1944 | Swanson ........................ 176/34 |
| 3,384,076 | A | * | 5/1968 | Speeiman ...................... 362/551 |
| 3,582,637 | A | * | 6/1971 | Cecil, Jr. ....................... 362/581 |
| 3,597,647 | A | | 8/1971 | Rishton ......................... 313/110 |
| 3,681,592 | A | | 8/1972 | Hugelshofer .................. 240/47 |
| 4,233,493 | A | * | 11/1980 | Nath ............................. 362/572 |
| 5,103,381 | A | | 4/1992 | Uke .............................. 362/32 |
| 5,341,275 | A | * | 8/1994 | Ghanderhari ................ 362/583 |
| 5,457,611 | A | * | 10/1995 | Verderber ..................... 362/572 |

FOREIGN PATENT DOCUMENTS

| CH | 336125 | * | 3/1958 | .................. 362/551 |
| DE | 41 27 100 A1 | | 2/1993 | |
| EP | 0 304 939 A2 | | 1/1989 | |
| GB | 2117131 | * | 10/1983 | .................. 362/551 |

* cited by examiner

Primary Examiner—Y. My Quach-Lee
Assistant Examiner—Peggy Neils
(74) Attorney, Agent, or Firm—Davis & Bujold, P.L.L.C.

(57) ABSTRACT

A light outputting device comprises; a containment (14) for housing an element for emitting light (11); at least one axially extending light conducting element (13) having an axial length substantially greater than its width transverse the axis; the light conducting element (13) being aligned axially with the element for emitting light (11) by means of the containment (14) or an extension thereof; the, or each, light conducting element (13) having a light input region such as an end face whereby light generated by the element for emitting light (11) is caused to pass axially into the or each light conducting element (13) by way of its associated light input region. Typically the axial length of the light conducting element (13) is at least three times its width transverse the axis. The containment (14) or an extension thereof serves to locate the element for emitting light (11) closer to the light input region of the, or each, light conducting element (13) than to the major part of the containment (14) remote from the light input region or regions.

6 Claims, 7 Drawing Sheets

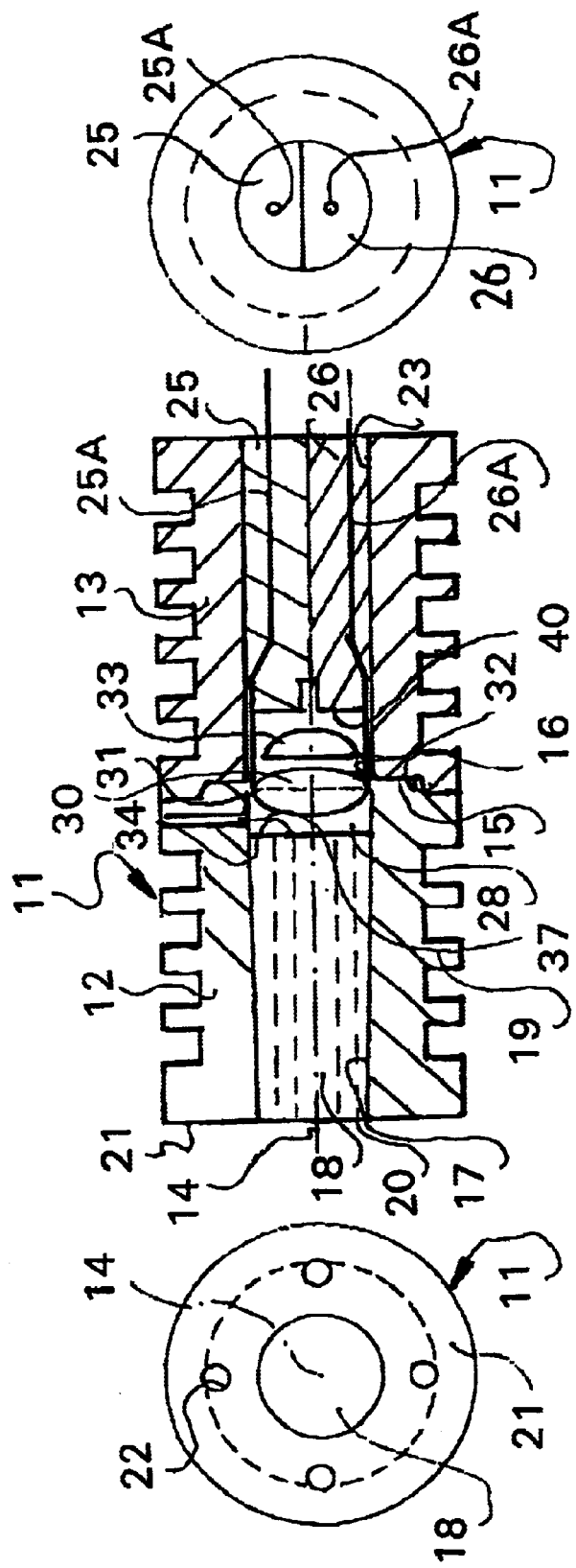

LIGHT EMITTING DEVICE AND ARRAYS THEREOF

TECHNICAL FIELD

This invention relates to a light emitting device and arrays thereof. The term 'light' is used in this context to include any form of electromagnetic energy where a need exists to generate it at one location for transmission and utilisation at a further location

BACKGROUND ART

Light conducting elements, for example fibre optics, are a well known means of conducting light from a remote source to a desired destination. State of the art fibre optic cables allow relatively large amounts of energy to be transported through relatively small fibres that are flexible, strong, and water resistant. However inputting light energy into relatively small fibres from existing light sources can be expensive as the light sources were not necessarily originally designed for this purpose.

Most light emitting devices consist of an element for emitting light such as a filament surrounded by a vacuum or a gas or gas mixture or an arc contained in a transparent housing. Alternative types of light emitting device are a light emitting diode surrounded by a solid transparent material. Light emitted from the source radiates outward and can be reflected or concentrated by external mirrors and/or lenses in the correct direction and at the required concentration. However suitable lenses and/or mirrors have to be accurately manufactured and are relatively expensive. In use they tend to absorb the energy that is being produced. Due to manufacturing limitations the lens and/or mirror can fail to be an optimised configuration to refract/reflect the light from the source. When otherwise appropriately manufactured by existing techniques such mirrors and/or lenses fail to control the light sufficiently.

Light conducting fibres have a limited acceptance angle which means that unless the directed light is presented to the conducting element at the maximum angle or less the light is not conducted. Also every occurrence of reflection and/or lens transmission can absorb or scatter between 10 and 30% of the original light. If we add to these losses from absorbtion and transmission Further losses can be added to those of absorbtion and transmission including: those from reflector shape and size; from surface input into the fibre; and through the bulb containment housing. When all these losses are added together there is left a relatively small balance from the transmitted original light.

In order to overcome such losses many current designs utilise brighter and larger light sources. This comes at a price because apart from light such sources produce large amounts of heat which combined with bad directional control can lead to overheating of the bulb and the light conducting fibres. This leads to a requirement for an external fan or other cooling device which adds cost and bulk and an overall increase in energy required by the whole process.

These factors all limit the commercial applications for light conducting elements as the commercial cost outweighs the usefulness of the product. Alternatively the size of the device and/or its energy requirements exceed those of components available to product designers.

DISCLOSURE OF INVENTION

According to a first aspect of the present invention there is provided a light outputting device comprising:
 a containment for housing an element for emitting light;
 at least one axially extending light conducting element having an axial length substantially greater than its width transverse the axis; the light conducting element being aligned axially with the element for emitting light by means of the containment or an extension thereof; the, or each, light conducting element having a light input region such as an end face whereby light generated by the element for emitting light is caused to pass axially into the or each light conducting element by way of its associated light input region. Typically the axial length of the light conducting element is at least three times its width transverse the axis.

According to a first preferred version of the first aspect of the present invention the containment or an extension thereof serves to locate the element for emitting light closer to the light input region of the, or each, light conducting element than to the major part of the containment remote from the light input region or regions.

According to a second preferred version of the first aspect of the present invention or the first preferred version thereof the containment incorporates a reflector located relative to:
 the element for emitting light and
 the, or at least one, light conducting element so as to reflect light from the element for emitting light into the, or at least, one light input region of the light conducting element.

According to a third preferred version of the first aspect pf the present invention or any preceding preferred version thereof the containment incorporates a refractor located relative to:
 the element for emitting light and
 the, or at least one, light conducting element
 so as to refract light from the element for emitting light into the, or at least one, light input region of the conducting element.

According to a fourth preferred version of the first aspect of the present invention or any preceding preferred version thereof the containment is substantially opaque and light can only pass out of the containment from the element for emitting light by way of the, or at least one, light conducting element.

According to a fifth preferred version of the first aspect of the present invention or any preceding preferred version thereof there is provided heat transfer means such as a heat sink in intimate contact with, or forming an integral part of, the containment whereby heat generated by the element for emitting light can be dissipated.

According to a sixth preferred version of the first aspect of the present invention or any preceding preferred version thereof there is provided heat transfer means such as a heat sink in intimate contact with, or forming an integral part of the, or at least one, light conducting element whereby heat generated by the element for emitting light can be dissipated.

According to a seventh preferred version of the first aspect of the present invention or any preceding preferred version thereof the containment serves to define a plenum about the element for emitting light whereby a vacuum or an inert gas or a mixture of gases to be maintained by means of the plenum about the element for emitting light.

According to an eighth preferred version of the first aspect of the present invention or any preceding preferred version thereof wherein the element for emitting light is contained in an envelope within the containment and the envelope serves to define a plenum about the element for emitting light whereby a vacuum or an inert gas or a mixture of gases to be maintained by means of the envelope about the element for emitting light.

According to a ninth preferred version of the first aspect of the present invention or any preceding version thereof there are provided means for varying the colour of light output by the device.

According to a tenth preferred version of the first aspect of the present invention or any preceding preferred version thereof the element for emitting light comprises more than one light emitter so that the element for emitting light can be used to emit more than one light wavelength.

According to an eleventh preferred version of the first aspect of the present invention or any preceding preferred version thereof the containment serves to provide a location means for the device adapted for complementary engagement with an external device whereby the device can be demountably attached by means of the light conducting element or an extension thereof to a further light conducting path in a predetermined position relative to some path datum.

According to a further preferred version of the first aspect of the present invention the containment comprises a housing defining a passage in which the light conducting element is located, the passage having an inner end located within the containment serving as a wall of a chamber within the containment; the chamber serving to locate the element for emitting light. Typically the housing is opaque.

According to as first preferred version of the further preferred version of the first aspect of the present invention the chamber serves to house, or has a boundary region serving to define, means for reflecting or refracting light emitted by the element for emitting light.

According to a second preferred version of the further preferred version of the first aspect of the present invention the containment incorporates integral fins or is in good thermal exchange contact with a member incorporating fins; the fins serving to radiate heat generated by the element for emitting light and conducted to the fins by way of the containment.

According to a third preferred version of the further preferred version of the first aspect of the present invention or any preceding preferred version of the further preferred version the containment includes a yet further passage whereby the chamber can be communicated with from outside the device to provide for varying the pressure in the chamber and/or for supplying the chamber with a gas or vapour.

According to a fourth preferred version of the further preferred version of the first aspect of the present invention or any preceding preferred version of the further preferred version the containment comprises two parts demountably coupled to one another so that on being uncoupled they serve to expose the interior of the chamber. Typically the two parts of the containment each provide or contain a path of electrically conducting material and when assembled the two paths are:

electrically insulated from one another; and coupled to the element for emitting light to enable electrical power to be supplied to the element.

According to a fifth preferred version of the further preferred version of the first aspect of the present invention or any preceding preferred version of the further preferred version the containment includes a further passage for a conducting means for supplying electrical power to the element for emitting light. Typically the further passage can extend axially along, or radially from, the device.

According to the first aspect of the present invention or any preceding preferred version thereof the element for emitting light comprises one or more of the following: a resistive filament; an arc; a discharge device; a solid state emitter (pn junction), a coherent light source with means for light stimulation and amplification.

According to a second aspect of the present invention there is provided a method of fabricating a light outputting device according to the first aspect or any preferred version thereof is characterised by the steps of:

providing the light conducting element in the form of a longitudinal member with end faces and an outer surface apart from the end faces;

locating around the light conducting element a sleeve member of greater length than the light conducting element with a first end of the light conducting element at or near one end of the sleeve so as to leave a length of sleeve projecting beyond the opposite end of the light conducting element to the first end;

the opposite end of the light conducting element to the first end forming, at least in part, the light input region;

causing the sleeve member to be contiguously juxtaposed with the outer surface of the light conducting element;

locating the element for emitting light in the length of sleeve projecting beyond the opposite end;

deforming the length of sleeve so as to form together with the light input region of the light conducting element the containment for the element for emitting light; and sealing the deformed length of tube to cause the containment to form a gas tight enclosure for the element for emitting light.

According to a first preferred version of the second aspect of the present invention the sleeve is of a similar material to the light conducting member and the step of causing the sleeve member to be contiguously juxtaposed with the outer surface of the light conducting element comprises a fusing operation. Typically the sleeve is of a translucent or opaque material having a thermal coefficient of expansion comparable with that of the light conducting member.

According to a second preferred version of the second aspect of the present invention or the first preferred version thereof the step of locating the element for emitting light in the length of sleeve projecting beyond the opposite end includes locating conductors for supplying energy to the element.

According to a third preferred version of the second aspect of the present invention of any preceding version thereof the step of locating the element for emitting light in the length of sleeve projecting beyond the opposite end includes locating a mirror element for reflecting light generated by the element for emitting light to enable the mirror element to be enclosed with the element for emitting light in the containment prior to the deforming and sealing steps.

According to a fourth preferred version of the second aspect of the present invention or of any preceding preferred version thereof the step of locating the element for emitting light in the length of sleeve projecting beyond the opposite end includes locating a lens element for refracting light generated by the element for emitting light to enable the lens element to be enclosed with the element for emitting light in the containment prior to the deforming and sealing steps.

According to a third aspect of the present invention there is provided an array comprising at least two devices according to the first aspect of the present invention or fabricated by means of a method according to the second aspect and a light guide array linking the or at least one light conducting element to a light output location remote from at least one device. Typically at least one of the devices is coupled to a heat exchange means whereby heat generated by the or each device is dissipated such as by natural or forced convection utilising gas or liquid coolant.

According to a first preferred version of the third aspect of the present invention there is incorporated in the light guide array or the light output location means for varying the colour of light originating from at least one of the devices.

According to a second preferred version of the third aspect of the present invention at least one of the devices is demountably attached to the array and a magazine of replacement devices is located for the demountably attached device to enable the demountably attached device to be readily removed and replaced by a replacement device from the magazine thereof.

An object of this invention is to collect light close to the source such as a filament, arc, diode, NP junction, laser or semi-conducting light emitting device where the light energy is at its most concentrated. This saves on a requirement for larger and or complex external lenses and mirrors. The light is positioned close to, and is fed directly into, a light guide, so saving energy losses which arise from the use of: reflectors, lenses, and containment housings. As the device can use any simple or complex state of the art system it can be mass produced.

Even where direct connection is not required the light energy is output in a very concentrated form which allows smaller light guides to be connected to the devices output. This contrasts with larger light guides required with presently existing systems utilising less efficient light generation and conducting systems.

Where very large amounts of energy are required, existing devices are limited by overheating of the separate components. The present invention enables a cooling system to be readily employed. If required excess heat energy can be made use of.

The present invention also provides for devices of greater strength than heretofore to improve longevity. Typically these can be used in vehicles where, for example, the device can be linked to a vehicle cooling system. The invention also provides for devices to be much more efficient so in many cases avoiding the need for a cooling systems which is required in current applications.

The combined emission and collection device, surrounds an element for light emission such as a filament or arc, or a laser or light emitting semi conductor device, by one or more light conducting elements, that are slightly spaced from the element, arc, etc. or in the case of solid state lights, i.e. light emitting diodes, the light conducting element is inserted into a solid body. In all cases the light conducting element, is designed to carry light from the source of the bulb, or device, to the edge of its case, through vacuum or gas, liquid or solid. The light conducting element can stop at or on the inside of the case, or continue through the outer case. which is still sealed or solid, to a distance that is directly to the required output of the light, or to a distance and shape, that is suitable for the easy connection of flexible or other light guides, or light conducting devices.

The number of these internal light conducting elements can be reduced by internal mirrors and or lenses, and their collection or function, enhanced by the use of state of the art materials, solids or coatings. The covering of the bulb, solid or coatings may no longer all be required, for the transferral of light, and therefore can now be constructed by moulding, from a non transparent state of the art material, for example a metal, that would allow the total device to be stronger quite apart from enabling the provision of any other desired property. A gas or liquid, or case can be used to circulate a gas, or liquid, to collect heat energy for cooling or energy maximisation, thorough for example a heat exchanger, which can be incorporated as part of the device.

A fluorescent material can be used in conjunction with, or incorporated in, a device according to the present invention so that on being excited by light emission from the light emitting element the material fluoresces to generate a distinctive optical effect.

The devices of the invention lend themselves to a wide range of applications some of which will be exemplified or referred to later. Usage of the invention in a communication context is particularly appropriate in view of the efficient usage of light and the possibility of miniaturisation made available by the present invention.

BRIEF DESCRIPTION OF DRAWINGS

Exemplary embodiments of the invention will now be described with reference to the accompanying drawings of light emitting and channelling devices in which:

FIGS. 9A to C show longitudinal and end views of an eighth embodiment; and

MODES FOR CARRYING OUT INVENTION

FIG. 1

Figure 1:
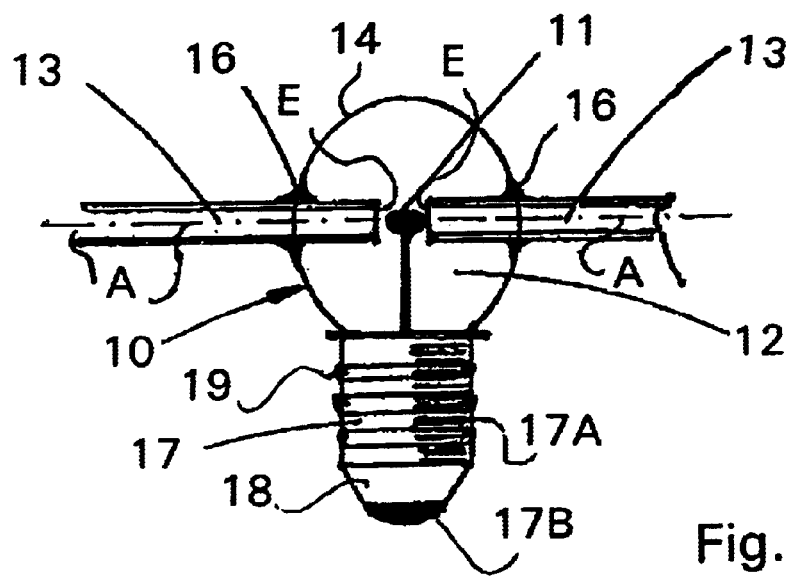
FIG. 1 shows a side view of a first embodiment.

Device 10 comprises of a light emitting element 11 housed in a containment 14 in this case of glass which serves to retain a vacuum in plenum 12 around light emitting element 11. Conducting elements 13 extend towards element 11 and serve to capture most of the energy emitted by the element 11. This energy is guided out of the device to the end of the light conducting element 13 outside the containment 14 where the light energy can be used directly, or by way of a light emission system utilising fibre optic cable for onward transmission. Each light conducting element 13 is solid and is sealed to the containment 14 at region 16 with axis A directed towards element 11. Each light conducting element has an axial length at least three times the lateral width of the conducting element measured transvers the axis A. The sealing ensures a required vacuum is maintained in the containment 14. Each conducting element 13 has an end face E set square, and close to, emitting element 11 to provide for efficient light transfer from emitting element 11 into each conducting element 13.

The containment 14 is mounted on a base 17 by means of which the device 10 is connected to a power supply. In this case the bases 17 comprises two main parts 17A, 17B that are electrically insulated from each other by insulator 18 to provide a means of connecting the element 11 to a supply of electricity. The base 17 is formed with a screw thread 19 enabling the device 10 to be secured to a conventional socket.

FIG. 2

Device 20 is similar in many respects to that described above in relation to FIG. 1. However in this embodiment light emitting element 21 is located in a plenum 22 having a gas filling rather than a vacuum. Containment 24 is made from quartz glass and serves to locate conducting elements 23 with axis A directed towards and their end faces E close to and square with the emitting element 21 to provide for effective light transfer axially into each conducting element 23. Base 27 provides for the accurate location of the of the device.

FIG. 3

Device 30 is constructed as described above in relation to FIG. 1 saving that in this embodiment only one light conducting element 33 is located with its axis A and end face E directed towrads one side of light emitting element 31.

Light from the other side of the emitting element 31 is reflected back into end face E of the conducting element 33 by a shaped and coated reflector 38. Base 37 functions in an identical manner to that of base 17 referred to in the description of FIG. 1.

Figure 4:
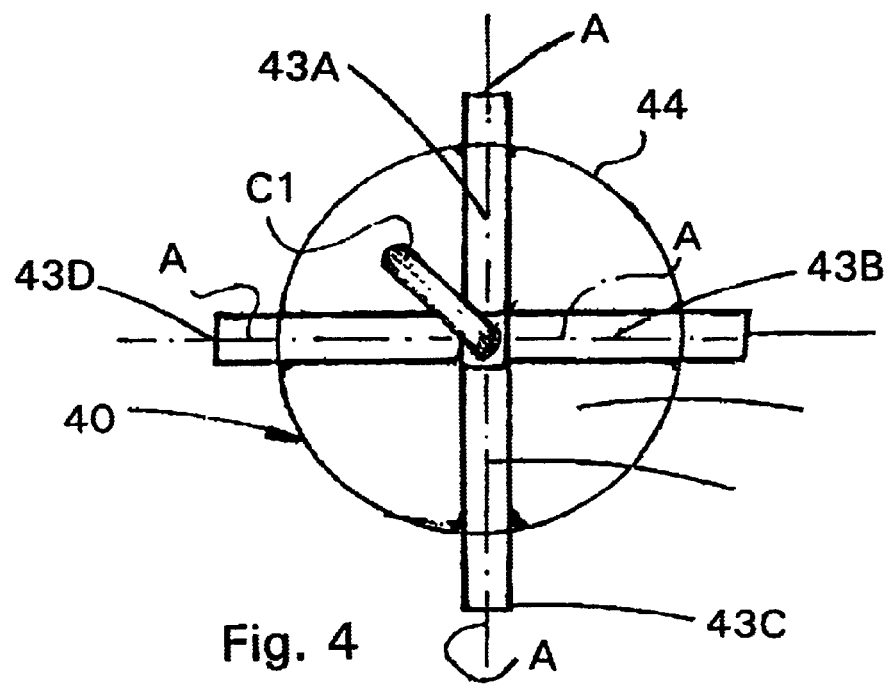
FIG. 4 shows from a top view a section through a fourth embodiment.
Figure 5:
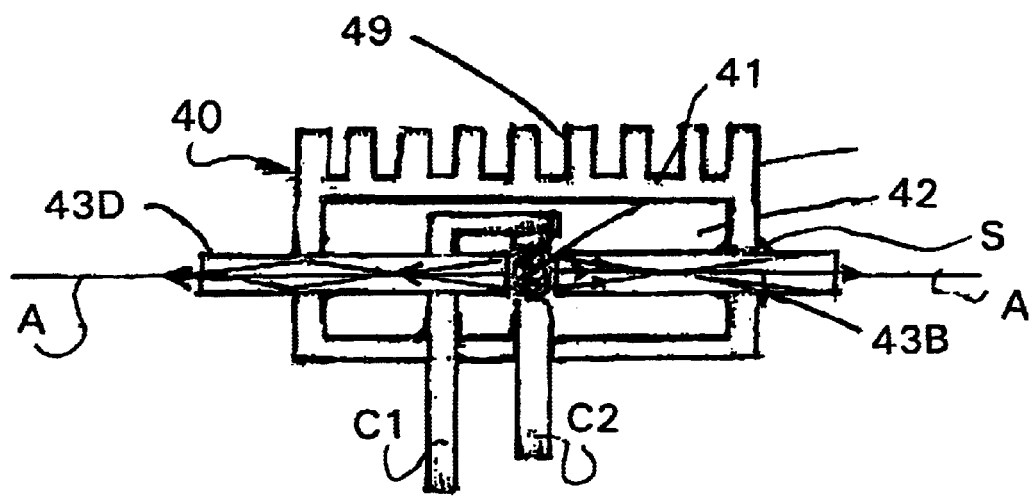
FIG. 5 shows a side sectional view of the device of FIG. 4.

FIGS. 4 and 5

Device 40 has a light emitting element 41 surrounded by four conducting elements 43A to D. The conducting elements 43A to D pass through the wall of containment 44 by ways of seals, typically seal S for element 43B. Each conducting element 43A to 43D has longitudinal axis directed towrads element 41. End faces E of each conducting element within the containment are set squarely towards the emitting element 41. As a high power device 40 containment housing 44 is made from a state of the art ceramic material which is heat conducting and extremely strong. The containment has cooling fins 49. Plenum 42 serves to retain a gas filling. The light emitting element 41 is coupled by conductors C1, C2 of substantial cross section.

FIG. 6

Device 60 has a light emitting element 61 is provided with a back reflector 68 which emits a narrow beam of light energy which is in turn collected by end face E of light conducting element 63 and so transmitted through containment 64 to output 65. Conducting terminals 67A, 67B provide electrical power to the light emitting element 61 and the containment 64, in this case of plastics material, supports the terminals 67A, 67B in relation to each other.

FIG. 7

Figure 6:
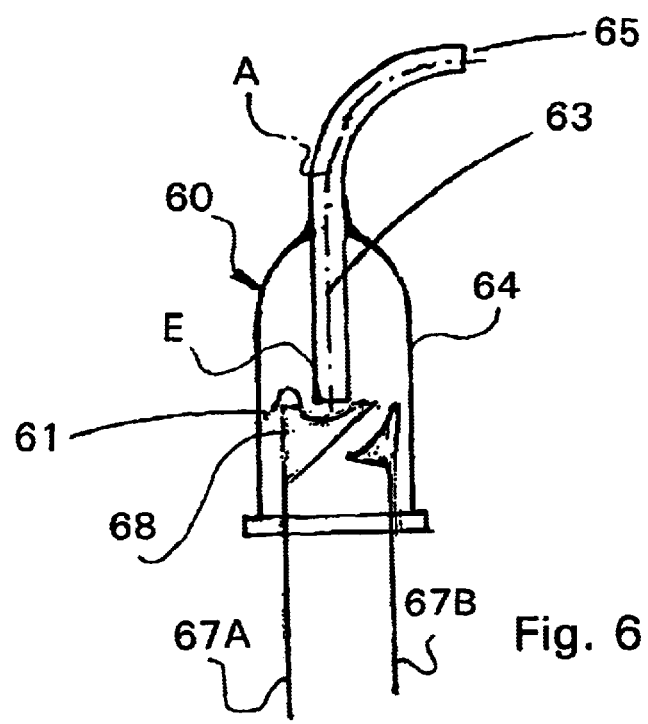
FIG. 6 shows a side view of a fifth embodiment.

This embodiment is a device 70 similar to that described in relation to FIG. 6 saving that light emitting element 71 is inserted directly into a light conducting element 73 to contact end face E of the conducting element 73. In this case containment 74 forms a part of light conducting element 73 which is of plastics material. The light emitting element 71 can be any state of the art electromagnetic energy emitting material and can be customised to match the light conducting element 73 or elements. The design of the whole device 70 is adapted to minimise any interference with the output of the electro magnetic energy while enhancing its functional efficiency.

The light conducting element 73 is of quartz glass where necessary coated or multi coated or enhanced by a light modifying coating. The light conducting element 73 can itself be made by one or more smaller coated elements fused together. These elements 73 can be manufactured from any state of the art material or process with coatings as above or process that can enhance transmission function of desired electro magnetic energy wave lengths.

Figure 3:
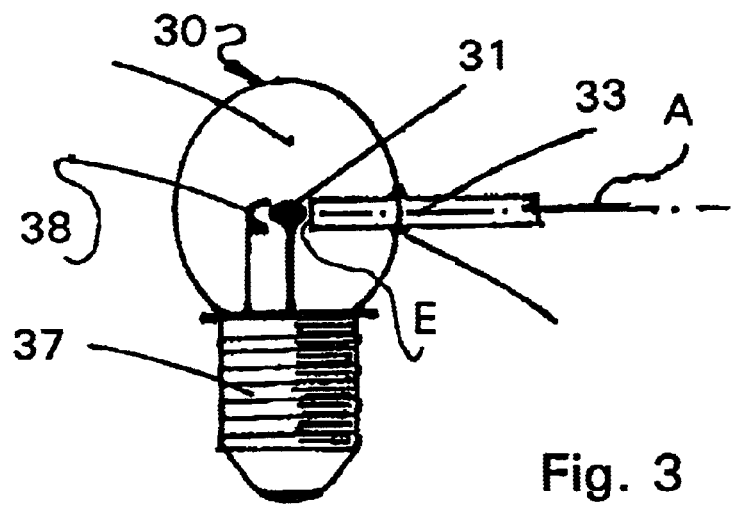
FIG. 3 shows a side view of a third embodiment.

The shape of these light conducting element 73 is matched in number, size and shape to maximise the collection of electromagnetic energy from the light emitting element 71. Preferably these light conducting elements 73 are solid, composite or hollow or liquid or any combination of these or other state of the art light guiding systems. The elements can be curved, flexible, sheathed, straight, coiled, amorphous, or have any property or shape that enhances its function. lenses or other state of the art light modifiers. Reflectors corresponding to those shown in FIG. 3, 6 or 7 may be of any material or shape and can be used in or on any internal or external part of the device and be coated or treated with any state of the art coating or enhancement method.

FIGS. 8A to 8E

This shows in sequence the fabrication of a light emitting device.

Figure 8A:
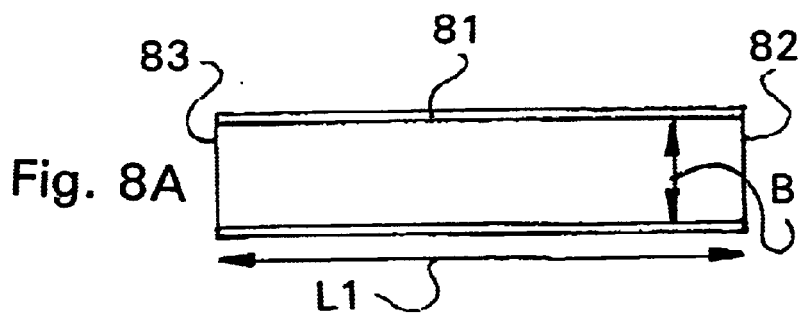
FIG. 8 shows the manufacture of a seventh embodiment.
Figure 8B:
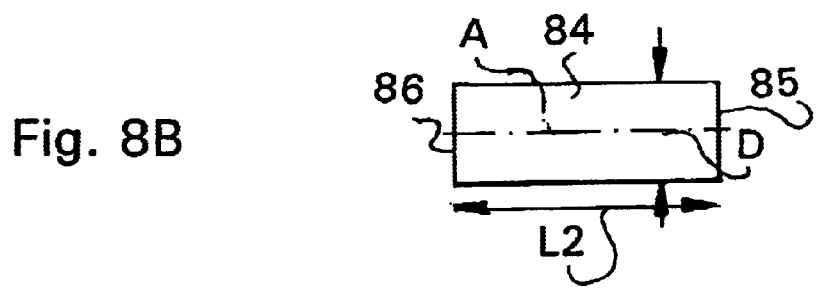

FIG. 8A shows a sleeve 81 of quartz glass with flame polished ends 82, 83. The sleeve is of length L1 and internal bore B FIG. 8B shows a light conducting element in the form of a quartz glass rod 84 of length L2 and external diameter D with square cut ends 85, 86.

Figure 8C:
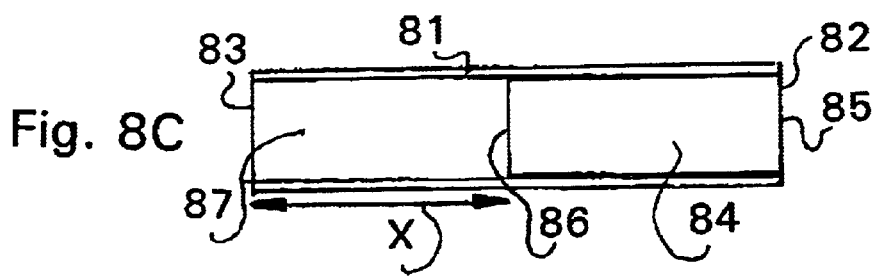

FIG. 8C shows the sleeve 81 positioned around rod 84 with end 82 of sleeve 81 aligned with ends 85 of rod 84. As the length L1 of the sleeve is considerably greater than rod 84 the sleeve extends over a further distance X beyond end 86 of the rod 84 to provide a recess 87. End 86 of rod serves as a light input region for light entering the rod 84 as will be described hereafter.

The sleeve 81 and rod 84 are then fused together to form a unified structure. As the material of the sleeve 81 and the rod 84 are identical thermal cycling does not result in the generation of thermal stressing. If necessary the fused or otherwise linked sleeve and rod can be subjected to an annealing treatment to remove internal thermal stresses generated by the production process.

Figure 8D:
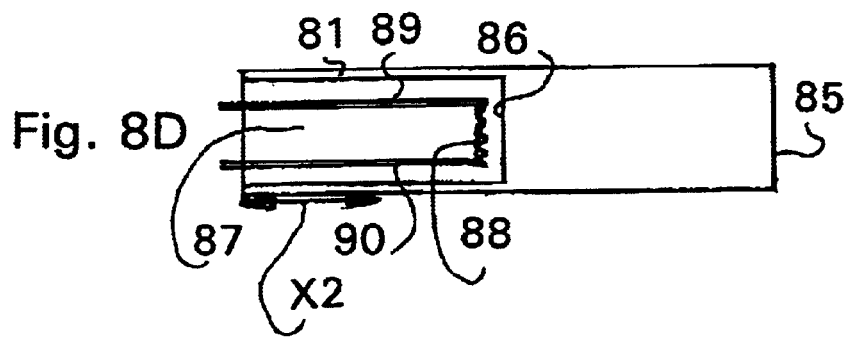

FIG. 8D shows the unified structure prior to closure of the recess 87 by heating and closing. Light emitting element 88 and conductors 89, 90 are shown located in the recess 87 with the light emitting element set 1 mm, or closer, to end 86 of the rod 84 which serves as a light input region for the rod 84. The outer length X2 of projecting length X of sleeve 81 is then heated and pressed to form a sealed closure through which conductors 89, 90 extend from the containment C for element 88. By juxtaposing light emitting element 88 very close to end 86 (the light input region) of rod 84 which serves as the light conducting element of the device the element 88 when energised causes the device to function as a very efficient light utilising and supply means. Axis A of rod 84 is directed towards element 88.

Figure 8E:
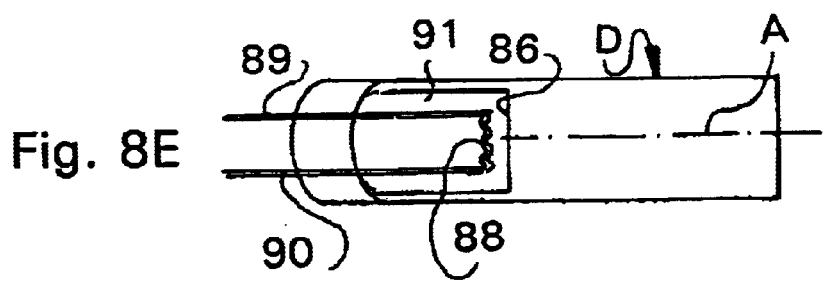

FIG. 8E shows the completed device D with projecting conductors 89, 90 available for attachment to a power supply. The light emitting element 88 is shown within a plenum 91 which in this case has been evacuated to maintain a vacuum in the vicinity of the element 88.

For use the device D can be used as a discrete item to provide a compact and bright source of light or be coupled to a further light conductor or other light using device by way of end face 85. If required the device can be used in conjunction with a light conductor which can split to create at least two further light paths or to provide a lateral light projection from the side wall of the light conductor.

The device D has been described in terms of a circular section sleeve 81 and a rod 84. However elements of other cross sections can be used depending on the required path to be provided for the light. In addition the cross section of the light conducting path can be changed for whatever reason. This the device D can be used as a circular section light source for a light conducting path which changes in cross section to provide an outlet, display, end of non-circular shape.

Once the device has been formed the outside of the device, or at least of the containment, can be coated, such as with silver or other reflective medium, to optimise the output of the light emitting element into the light input region of the light conducting element. If necessary the step of forming the containment can provide for the containment itself, at least in the vicinity of the emitting element, to have a shape which contributes to the effectiveness of light output from the device. Thus with a coating the specially shaped region of the containment can provide an external mirror with the light emitting element at a focal point of the mirror. Alternatively the specially shaped region can form a lens providing for refraction of light emitted from the emitting element.

In other embodiments of the device the step of locating the light emitting element within the sleeve length X can also include the location of mirror and/or lens elements relative to the light emitting element prior to the forming of the sealed containment.

FIGS. 9A to C

A light emitting device 11 has a containment made up of first and second coaxial thick walled tube members (first member 12 and second member 13) with a common longitudinal axis 14. The first member 12 and second member 13 are of tungsten. Molybdenum is also suitable. First member 12 has a spigot 15 which serves to align with annular recess 16 of second member 13.

The first member 12 has a passage 17 extending through it in which is located a light conducting element 18 of quartz coaxial with axis 14. The light conducting element has an axial length at least 2.5 times its mean width transvers the axis 14. The first member 12 is formed as a very close fit around the light conducting element 18 so that the first member 12 is in good heat transfer relationship with the element 18. Apart from the protection provided to the light conducting element by the first member 12 the heat transfer relationship serves to avoid the maintenance of any hot spots in the light conducting element by providing for efficient heat removal. The first member 12 is provided with an array of fins along its outer side, typically fin 19, to provide for an enhanced area for radiating heat transferred to the first member 12. Outer end 20 of the element 18 is located at the same level as outer surface 21 of first member 12. The outer surface 21 is provided with threaded holes 22 whereby a fibre optic harness and/or filter can be accurately aligned with and secured to device 11.

The second member 13 has a second passage 23 extending through it in which is mounted units 25, 26 each made up of a quartz half rounded block each incorporating a conductor 25A, 26A. These conductors provide a pair of axial conductors for powering a light emitter as will be described hereafter. This configuration enables a good gas tight closure to be maintained while providing electrical power supply to a lamp forming a part of the device 11 as will be described hereafter.

The assembled members 12, 13, their associated quartz member 18 and the pair of members 25, 26 when assembled serve to define a chamber 28 in which is located a light emitting element 29 in the form of a discharge lamp 30 having a pair of electrical terminals 31, 32 coupled to, respectively, conductors 25, 26 whereby the lamp 30 is energised. A polished mirror 33 is located in the chamber 28 at a suitable position relative to the light emitting element 20 to provide for light from the lamp 30 to be reflected back towards input face 34 of conducting element 18.

A further passage 37 extends radially through first member 12 and serves to provide means for pressurising and/or adding gas to the chamber 28 to enhance optical performance of the device 11.

In this embodiment end wall 34 of chamber 28 formed by the end of quartz member 18 and end wall 40 of members 25, 26 are shown as plane surfaces. In an alternative embodiment one or other or both of end walls corresponding to end walls 16, 40 can be shaped to enhance the optical functioning of the device. Typically the end wall corresponding to wall 16 can be shaped to complement the shape of the adjacent face of the lamp 28 so as to enable the lamp to be set very close to the light input end of quartz member 18 so ensure that the light emitting element 29 is as close as possible to the light input end 16 of quartz member 18 for optimum transmission efficiency. Likewise a wall corresponding to end wall 40 provided by the conductors can be shaped and coated to provide an integral mirror to replace or supplement the mirror 33.

This exemplary embodiment shows a light emitting device making use of a casing in two or more parts (which can be insulated from one another) to enable an internally mounted light emitting means to be energised by way of the casing. The casing can contain gas or a solid based light emitting elements. The casings can be sealed in the case of a disposable device or be demountable so as to be capable of being serviced.

The light emitting elements can be a filament (such as a tungsten) run at an incandescent temperature or a gas discharge capsule in the from of a quartz container with electrodes with a solid salt which when activated melts to produce an arc in a gas.

FIG. 10

Light emitting device 41 is made up of a quartz light conducting member 42 with a flanged end 42A and a quartz body member 43. The members 42, 43 are fused together along plane P to create a chamber 44 in which there is located a light emitting element in the form of a discharge lamp 45. From the rear of the body member 43 there extends a quartz axial member 46 having a concave inner face 47 having a mirror coating whereby to reflect light from the lamp 45 back towards face 48 of the chamber which provides a light input face to conducting member 42.

The axial member 46 serves to gas tightly house a conductor 49 for negative terminal 50 of lamp 45. The axial member 46 when the device is being fabricated also serves to provide a gassing duct for the chamber 48. Positive terminal 52 of the lamp 45 is supplied by a conductor 53 extending radially into chamber 44

The device 41 can be used either as shown as a substantially quartz bodied component or be shrouded with a close fitting container corresponding to members 12, 13 described in connection with FIG. 1A. Which version is used depends upon the application. Use of a close fitting container as discussed earlier contributes to a device of great mechanical strength and also enables heat to be removed from the vicinity of the device.

The design of a device as considered in the exemplary embodiments can either allow for the device to be opened up to enable the light emitting device to be replaced in part or provide for a disposable device which is replaced as a unit when it ceases to function.

Figure 2:
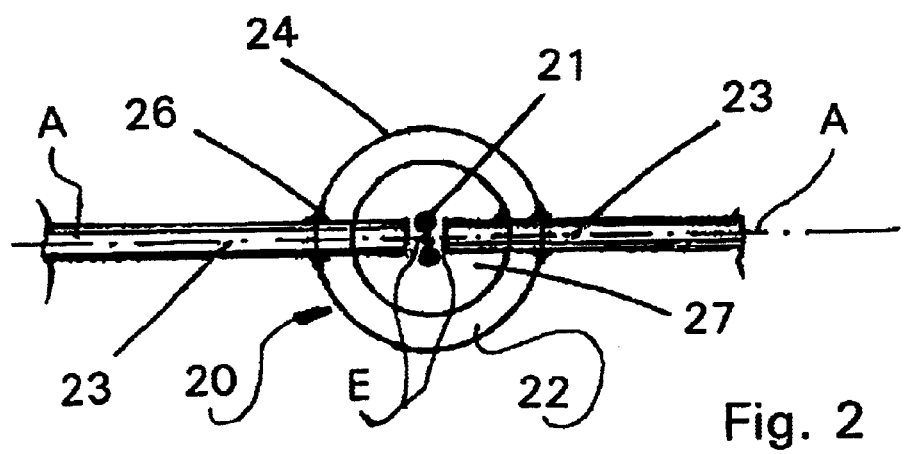
FIG. 2 shows a top view of a second embodiment.

The device of FIG. 2 is either used directly as a lamp unit or can be coupled to a fibre optic harness by means of the conducting member 42 or an extension thereof.

The embodiments refer to the use of quartz. However other specialised glass or glass like materials can be used depending on the application involved.

A casing when of metal or some other electrical conducting material can be coated or juxtaposed with insulating material to insulate or protect or seal the material relative to adjacent components.

Figure 10:
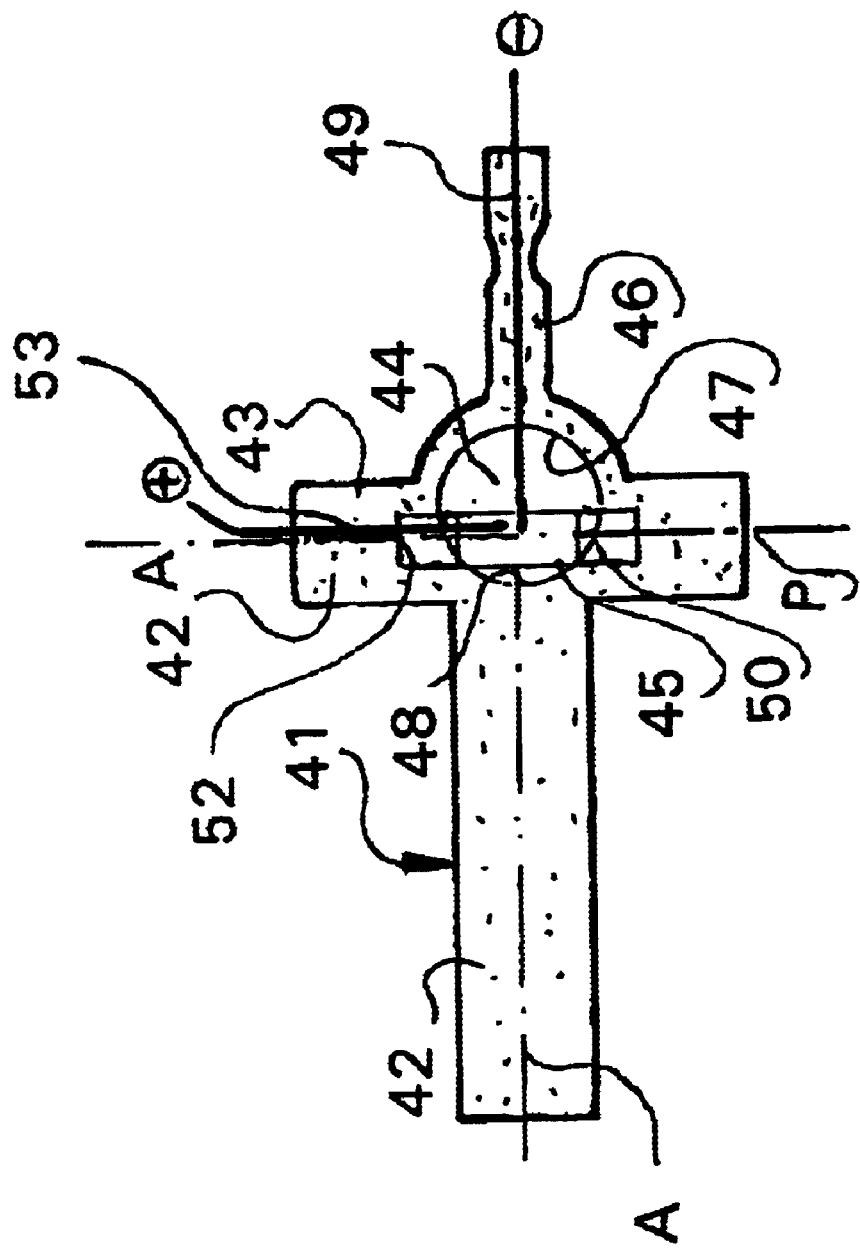
FIG. 10 is a longitudinally vertical section of a ninth embodiment.

The light conducting elements (18, FIG. 9; 42, FIG. 10) have not been described in detail. However they can be solid or made from fibres coated with material having a lower refractive index which are fused together to provide a rod and a seal to the containment housing through which the rod passes. The fibres may be drawn before or as a collection after fusing into rods which can be parallel or coned If desired the rods can be further shaped into lenses or coated with material of varying refractive index either sequentially or radially. Coatings can be included on any part or parts of a collection of fibres or rods. The ends of the rods can be etched, cut or otherwise shaped and can incorporate micro lenses.

It is possible to provide a light conducting system of rods to provide a focusable light at their output which can be focused by remote control. Such control can also be used to control movement of lenses or mirrors mounted inside or outside the combined device and light conducting rods.

A wide range of applications can be achieved by use of the proposed light outputting device. In addition without energising the light emitting element the device can serve as a static reflector such as for 'cats eye' type applications serving to define carriageways, lanes or road boundaries for land vehicles and at air ports to guide aircraft when ground manoeuvring.

INDUSTRIAL APPLICABILITY

The various embodiments can be used on their own as light bulbs. In this form the outer end of the, or each, light conducting member can be left square with the axis of the member so that light is emitted in an axial direction. Such a device (or a plurality of them) can be used for downlighting. In an alternative version the end of the light conducting member can be cut at an angle to give a wedge shaped end so as to provide for illumination lateral to the main of the light conducting member. I a yet further version the outer end of the light conducting member can be faceted or otherwise shaped to provide a light output for decorative purposes. By having a light conducting member whose axial length is greater than its transverse lateral dimension (say a length at least three times its lateral dimension) the light emitted from the outer end of the conducting member is cool. Such light is beneficially used for locations where excessive heat generation can lead to damage or undesirable effects on the illuminated objects such as works of art, food stuffs, animals or humans.

Figure 11:
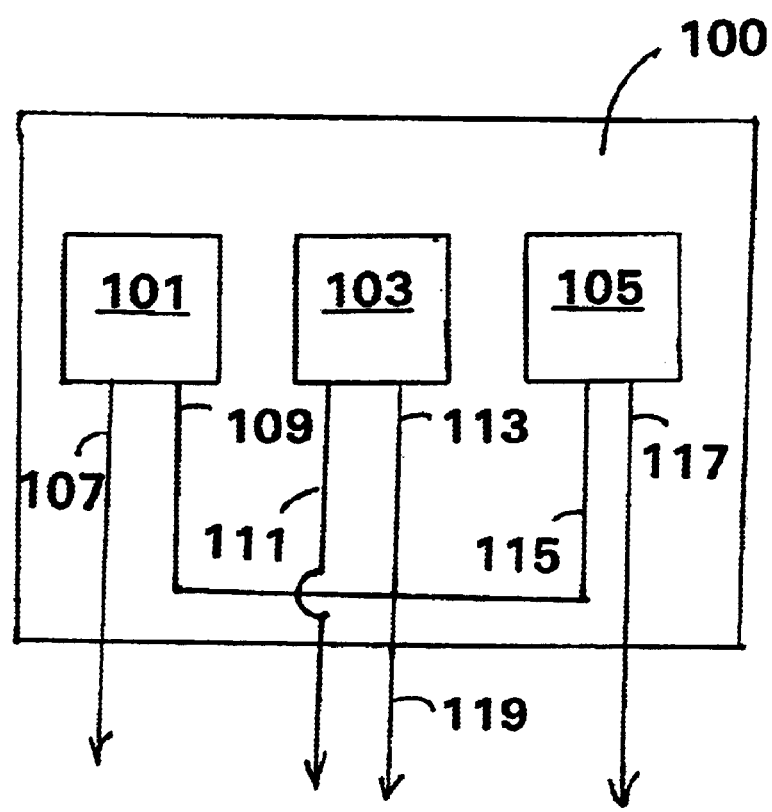
FIG. 11 is a diagrammatic representation of the color devices of the present invention.

In other embodiments the device of the present invention can be used in combinations where the, or each, device is optically coupled by way of its light conducting member or members to one or more optical system. By way of example, as shown in FIG. 11, a small lighting unit 100 is envisaged made up of three devices 101, 103 and 105 according to the present invention each utilising a primary light with two light conducting members 107, 109, 111, 113, 115 and 117 extending therefrom. Each device 101, 103 and 105 serves to generate a primary colour (one red, one blue, one yellow) one of the two light conducting in each case is fused into a single central member 119 so that with the three devices 101, 103 and 105 powered up the three primary colours are mixed in the central member 119 to provide a white output. The remaining single light conducting member 107, 111, 117 from each device 101, 103 and 105 is kept separate so that at the optical outlet from the unit 100 there are four light outputs, 119, 107, 113, and 117: the central white and single red, blue and yellow output. Such a device can be made in a small envelope and provide a range of illuminating functions.

It is also considered that an embodiment of the present invention could be made up of a unit including one or more devices utilising a sold state light emitter (pn junction) could be used to not only to transmit light but also to respond to light falling on them from the or at least one light conducting element of the device. This takes advantage of the fact that such a solid state device on being energised by a current acts to emit light but also conversely if the solid state device is illuminated it generates a current. Thus with a device running in a steady state with the light conducting member radiating from its outer end a given light output in the event a change occurs causing the light output to be varied this generates a feed back effect detected by the pn junction emitter which would in turn be detected by appropriate circuitry connected to the pn junction.

Any of the light emitting elements mentioned in connection with the embodiments can be used to provide for any wave length or be adopted to provide a combination of wave lengths of electro magnetic energy. Typically a light emitting element having different regions may be fitted within a given containment. Each region can be energised separately and each region serves to generate a different wavelength light compared to the remaining regions.

The combined device mentioned above may have at any part or parts of its construction coatings that are so spaced that when a coherent light source of monochromatic light is emitted from the light emitting device. The combined effect being to amplify that emitted light that is then further enhanced by materials chosen for their release of electromagnetic energy, when stimulated by the energy from the light emitting element or elements of the device.

The device may be so shaped that the element is almost touching or slightly spaced from its containment so allowing the light to be collected close to the element but on the outside of the housing by a light conducting element attached to the housing containment and utilising one or more reflectors, to enhance the systems function.

Figure 7:
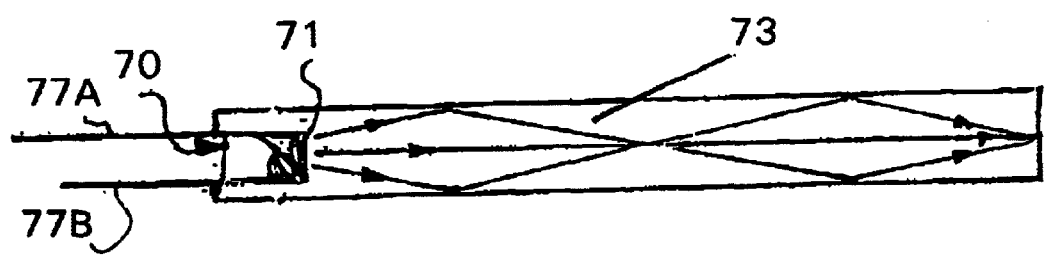
FIG. 7 shows a side view of a sixth embodiment.

The embodiments shown in FIGS. 6 and 7 are particularly suited for remote light indication systems. The light conducting elements 63, 73 can be taken directly to a lighting requirement via one or more conduit guiding systems. The devices 60, 70 would be disposable and held in place by a simple retainer The device can be removed from the remainder of the system for servicing or replacement without extensive or indeed any removal of local components such as bulkheads or cosmetic casings or coverings.

Desirable light modification can be achieved at any point in a given device for example, by moving as shown in FIGS. 4 and 5 one or more of the light conducting elements 43 towards or away from the light emitting element 41 inside the containment housing 44. In this way the output light energy can be made more or less concentrated.

Suitable existing devices and means can be used to provide for light generated by light emitting devices according to the present invention to be changed in scale of illumination, illumination level and in colour.

Devices as mentioned above can require very little energy and can be used to provide miniature lighting; for all applications where powerful hands free light is required especially in hobbies such as attachment to diving equipment or fishing equipment as reel or rod illumination or other hobbies or pastimes, industrial or domestic situations. They can be made as disposable and/or sterile and/or reusable especially in medical and surgical applications.

Miniature versions of the proposed devices can act as lighting or indication systems for miniature electronic assembles or components or act as relays or communication links or activate remote control of equipment or other sub assemblies. Lengths of light guides can be supplied as part of the component, such that service or construction personnel can cut the fibre easily to the required length and insert the output end directly into a holding device or into a conduit as described above.

One or more of these miniature devices emitting infra red or other wave lengths, into an adjacent similar light conducting element can be used to communicate a function or desired effect or message. The receiving fibre being connected in a similar way to a receiving and activation device.

The element for emitting light can include a number of filaments or other light emitters so that the light emitting device can emit at least two different light outputs depending on which filament or light emitting device is energised.

In addition an element for emitting light can be coated to enhance the direction of emission of light by the element.

The exemplary embodiments refer to the use of glass coatings for the light conducting element. However if necessary other coating materials can be used typically metal ones or opaque or translucent ones to vary the light transmission characteristics. In addition coating materials can either be formed of or be in good thermal conducting contact with metal or other heat transferring means providing for heat generated by the light emitting element to be conducted away from the device.

Coating of the light conductor will also serve to provide an optimised form of light transmission along the light conductor.

In many applications heat will be readily dissipated from the device whether by natural or forced convection. In applications where the device is located in a confined space or for some other reason is liable to overheating then a thermal cut out can be incorporated in the device or in good heat transfer contact with it so that in the event of overheating the power supply to the light emitting element is cut off and the device allowed to cool until the thermal cut off device is enabled to restore the power supply.

In small scale applications systems according to the invention can be incorporated into clothing or articles or where ever general or artistic lighting requirements have a requirement for the characteristics mentioned in this application.

For large lighting situations central lighting can be achieved by large versions of the above device. These large devices can utilise high power light emitting elements such as arcs. These devices can be used to light a whole building or other defined area. The large amount of heat generated by these units can be controlled in a safe maintenance area and incorporated into the heating system of the building, via heat exchangers and other state of the art exchange and control systems. The light is conducted from the light emitting unit, in this case an arc, via light conducting elements as described above. The containment for the arc and/or the light conducting element incorporate fins or other means to provide for efficient heat transfer from the containment and/or the light conducting element to a coolant circuit utilising gas or liquid coolant displaced by way of a natural or forced convention coolant circuit. Such units can be used to provide cold light for illumination but also to provide a substantial heat supply such as can be utilised to maintain or top up a heat supply for, say, an air conditioning unit. A typical use for such an installation would be in a store or supermarket where the arc system provides for general and sign illumination and the heat generated by the arc system can be used to provide for background air or water heating and/or air conditioning. Such a system can also be incorporated into day light collection systems as enhancement or back up with the energy being converted to heating water when the sunlight provides enough electricity for total lighting requirements but can reverse instantaneously should the sun be obscured such as by cloud.

The above devices can be used in any situation where remote and/or efficient light or heat energy is required for communication or inspection or control or heating or educational or any other application. For example a small device directly connected to a flexible or other light guide can be kept on an enclosed or open reel which is then pulled out and used as an inspection light the device being on a reel which is sprung loaded so that when a retainer is released the light guide springs back into its case.

Either end of the light conducting device can be shaped as a lens or coated or modified to enhance function by any state of the art -process or light modification technique for example polarisation of the transmitted light.

All or part of a light conducting element can be an amorphous light conducting material such that when pressure is applied to the external part of the light conducting element the shape of its end or other part is altered rather like a remote controlled amorphous lens.

A particular application for the present invention would be for endoscope for internal inspection of human or animal bodies where the miniaturising possibilities of the present invention serve to provide for advantageous designs.

The present invention provides for light outputting device and systems which can be utilised in a wide range of applications including: commercial and residential locations; medical and surgical sites; illumination of simple or elaborate displays, representations at point of sale devices; and control system displays varying from the simple to the very elaborate; signalling systems.

The invention also envisages an array made up of at least two light emitting devices each being linked by a light guide array linking the or, at least one light conducting element of a device, to a light output location remote from at least one device. Typically the array can, where necessary, be cooled by natural convection. Alternatively heat exchange elements incorporated in the device or the light guide array or both can be subject to natural or forced convection flows of air, liquid or a mixture. As an example a large scale installation using powerful light and heat emitting elements can provide for efficient illumination and heating (with or without at least a partial contribution to air conditioning) of a shopping, catering, medical, commercial or manufacturing location.

By incorporating suitable devices the invention can provide not only for fixed levels on illumination with any practical degree of definition but also for changes in light levels and colour. By incorporating mirrors and lenses within the enclosure it is possible for such devices to be small, accurately aligned and virtually incapable of being damaged by anything except virtual destruction of the device.

A device according to the present invention can be used for a range of applications where both light and heat are required to take advantage of inherent strength of a unit (for example of the type described in connection with FIG. 8). By providing a small bore in the light conducting member the device can be used as a pre-heater for a fuel supply.

Because of its inherent strength at least in small scale versions and its ability to operate at low voltages a device according to the present invention can be used in situations where safety is of paramount importance. In a decorative context low powered devices can be used in locations subject to crowding such as pubs, restaurants or transport such that in the event of damage, whether malicious or accidental will merely result in the loss of decorative illumination without exposure of conductors bearing life endangering voltages or currents.

The present invention lends itself through one or more of its embodiments to a very wide range of applications.

Electronic instrumentation where the light emitting elements for the device include single or multiple light emitting diodes, near infra-red emitter, single or multiple white lights.

| Power usage consumption/Brightness | Applications |
| --- | --- |
| Low/Bright devices | Mass production of cheap devices for hobbies, inspection, medical, dental. |
| Higher/High brightness | Miners head lamps, surgical, bicycle lighting, industrial inspection |
| Low/Bright | Particularly in miniaturised versions: Diving, surgical, mining, video and digital cameras, automotive. |
| High-Low voltage/ Special high brightness, high colour temperature | Aircraft, automotive, marine, industrial. |
| High/low voltage/ Very high brightness | Domestic light bulb replacement. Mini light bulb replacement. |
| High/Multi element, | Vandal proof lighting, energy efficient, safe |

-continued

| Power usage consumption/Brightness | Applications |
|---|---|
| gas or liquid cooled, 'cold' light, | light lighting system for hazardous environment, water heating or topping up in public utility uses, fire detection, security systems, hospitals, offices, retail, industrial, catering, hotels, large domestic. Air conditioning. |

What is claimed is:

1. A method of fabricating a light emitting device including a containment sleeve forming a housing for a light emitting element, the containment sleeve having a length greater than a width and having an opening extending axially through the containment sleeve, a light conducting element extending axially into the containment sleeve opening, an inner end of the light conducting element and an inner circumferential surface of the containment sleeve forming a recess for receiving the light emitting element and the inner end of the light conducting element forming a light receiving boundary surface whereby light generated by the light emitting element enters the light conducting element for passage along the light conducting element, the containment sleeve being of a similar material to the light conducting member; wherein the inner circumferential surface of the containment sleeve and an outer circumferential surface of the light conducting element have essentially identical traverse section shapes and dimensions in at least a region adjacent the light emitting element and the light emitting element is located directly adjacent to and spaced apart form the light receiving boundary surface of the light conducting element and conforms within the traverse section shape and dimensions of the inner circumferential surface of the containment sleeve and the outer circumferential surface of the light conducting element and the axial length of the containment sleeve and light conducting element, and wherein the light emitting element, the light conducting element and the containment sleeve in at least a region adjacent the light emitting element together form a unitary optically integrated unit, the unit being of essentially identical external traverse section shapes and dimensions; wherein the steps comprise:

providing the light conducting element in the form of a longitudinal member with end faces and an outer surface apart form the end faces;

inserting light conducting element into a containment sleeve of greater length than the light conducting element with a first end of the light conducting element at or near one end of the containment sleeve so as to leave a length of sleeve projecting beyond the opposite end of the light conducting element and so that the opposite end of the conducting element forms the light receiving boundary surface;

forming, at least in part, a light input region by causing an inner surface of the containment sleeve to be contiguously juxtaposed with the outer surface of the light conducting element;

causing the inner surface of the containment sleeve and the outer surface of the light conducting element which are contiguously juxtaposed to be join by a fusing operation;

locating the light emitting element in the length of containment sleeve projecting beyond the opposite end of the light conducting element;

deforming the containment sleeve so as to form together with the light input region of the light conducting element a containment for the light emitting element; and sealing the deformed length of containment sleeve to cause the containment to form a gas tight enclosure or the light emitting element.

2. A light emitting device, comprising:

a containment sleeve forming a housing for a light emitting element, the containment sleeve having a length greater than a width and having an opening extending axially through the containment sleeve;

a light conducting element extending axially into the containment sleeve opening, an inner end of the light conducting element and an inner circumferential surface of the containment sleeve forming a recess for receiving the light emitting element and the inner end of the light conducting element forming a light receiving boundary surface whereby light generated by the light emitting element enters the light conducting element for passage along the light conducting element; wherein the inner circumferential surface of the containment sleeve and an outer circumferential surface of the light conducting element have essentially identical traverse section shapes and dimensions in at least a region adjacent the light emitting element and the light emitting element is located directly adjacent to and paced apart from the light receiving boundary surface of the light conducting element and conforms within the traverse section shape and dimensions of the inner circumferential surface of the containment sleeve and the outer circumferential surface of the light conducting element; and the axial length of the light conducting element is at less 50% of the overall axial length of the containment sleeve and light conducting element; wherein the light emitting element and at least a portion of the light conducting element adjacent the light emitting element are mechanically permanently joined into a single unitary structure, and wherein the light emitting element, the light conducting element and the containment sleeve in at least a region adjacent the light emitting element together form a unitary optically integrated unit of essentially identical external traverse section shapes and dimensions.

3. The light emitting device according to claim 2, wherein the light emitting element is located within the containment sleeve closer to the light receiving boundary surface of the light conducting element than to a part of the containment sleeve remote from the light receiving boundary surface.

4. The light emitting device according to claim 2, further incorporating a reflector located relative to the light emitting element and the light conducting element so as to reflect light from the light emitting element axially into the light conducting element by way of the light receiving boundary surface.

5. The light emitting device according to claim 2, further incorporating a refractor located relative to the light emitting element and the light conducting element so as to refract light form the light emitting element axially into the light conducting element by way of the light receiving boundary surface.

6. A method for fabricating a light emitting device, comprising the steps of:

forming a light emitter interface sleeve having an axial opening;

forming a transverse face in en end of a light conducting element, the transverse face being adapted to receive light into the light conducting, axially locating the transverse face of the light conducting element in the sleeve, and axially locating a light emitting element in a recess formed by the axial opening of the sleeve and adjacent the transverse face of the light conducting element, mechanically permanently joining the light emitting element and at least a portion of the light conducting element adjacent the light emitting element into a single unitary structure, wherein the light emitting element, the transverse face of the light conducting element and the interface sleeve together form an optically integrated unit, and an inner surface of the recess and the transverse face of the light conducting element form an optical interface for coupling light emitted by the light emitting element into the light conducting element.

* * * * *